United States Patent [19]
Murphy

[11] Patent Number: 4,964,964
[45] Date of Patent: Oct. 23, 1990

[54] ELECTROPLATING APPARATUS

[75] Inventor: Timothy I. Murphy, Mahtomedi, Minn.

[73] Assignee: Unisys Corporation, Blue Bell, Pa.

[21] Appl. No.: 332,047

[22] Filed: Apr. 3, 1989

[51] Int. Cl.$^5$ ............... C25D 17/06; C25D 21/12; C25D 17/04
[52] U.S. Cl. ................... 204/224 R; 204/228; 204/DIG. 7; 204/297 R; 204/297 W
[58] Field of Search ............ 204/228, 224 R, DIG. 7, 204/297 R, 297 W, 129.1, 212, 224 YM, 225, 280

[56] References Cited

U.S. PATENT DOCUMENTS

| | | |
|---|---|---|
| 3,158,500 | 11/1964 | Sallo et al. |
| 3,437,578 | 4/1969 | Gibbs et al. ............ 204/DIG. 7 X |
| 3,632,499 | 1/1972 | Chessin ............... 204/228 X |
| 3,862,891 | 1/1975 | Smith ................ 204/DIG. 7 X |
| 3,880,725 | 4/1975 | Van Raalte et al. ..... 204/DIG. 7 X |
| 3,895,137 | 7/1975 | Avramidis et al. ............ 427/295 |
| 4,134,819 | 1/1979 | Kreisel ..................... 204/228 |
| 4,143,618 | 3/1979 | Del Vecchio ............... 118/603 |
| 4,174,261 | 11/1979 | Pellegrino ................. 204/273 |
| 4,174,262 | 11/1979 | van Mellaert et al. ....... 204/DIG. 7 |
| 4,262,044 | 4/1981 | Kuczma, Jr. ............... 427/438 |
| 4,478,882 | 10/1984 | Roberto ..................... 427/97 |
| 4,605,483 | 8/1986 | Michaelson .............. 204/297 R X |
| 4,606,787 | 8/1986 | Pelligrino ................. 156/632 |
| 4,622,917 | 11/1986 | Schramm ................... 118/696 |
| 4,628,726 | 12/1986 | Heikkila et al. ............ 73/61.1 C |
| 4,667,049 | 5/1987 | Heikkila et al. ............ 558/236 |

Primary Examiner—Donald R. Valentine
Attorney, Agent, or Firm—Frederick W. Niebuhr; Glenn W. Bowen; Robert S. Bramson

[57] ABSTRACT

An electroplating rack is constructed of corrosion resistant stainless steel, with oppposed side frames milled with vertical channels to accommodate opposite side edge portions of a printed circuit board for plating. Mechanical and electrical connections with the circuit board are made with recessed stainless steel screws with rounded tips. Current is provided to the top of the rack, and also to the bottom of each side frame through an elongate, vertically disposed copper bar surrounded by an insulative sheath and contained within each side frame. Each of the copper rods is threadedly engaged in a steel end cap at the bottom of the associated frame. The current fed into the top and bottom of the rack can be adjusted by adjusting the comparative conductivity of the two paths.

20 Claims, 3 Drawing Sheets

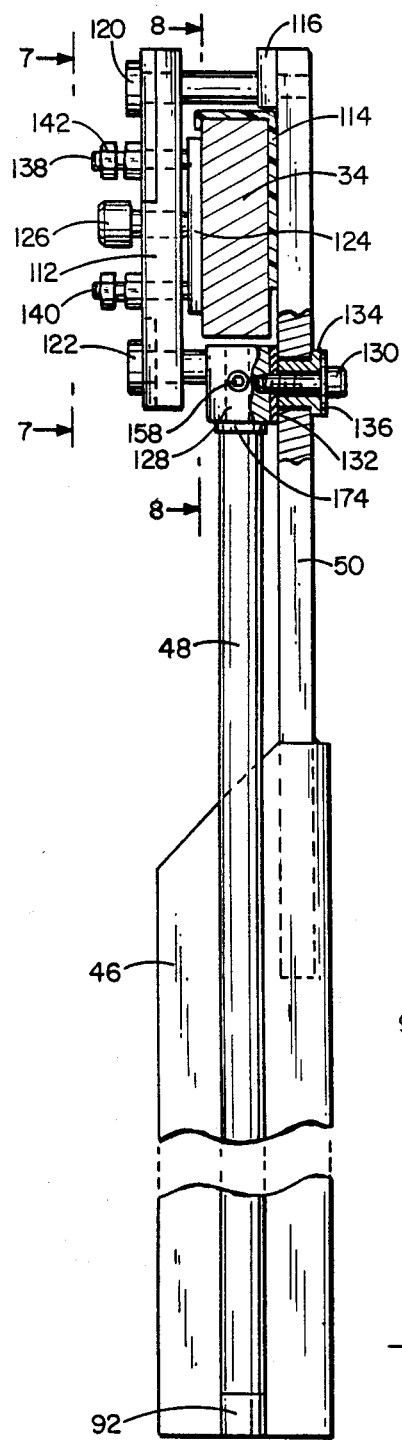
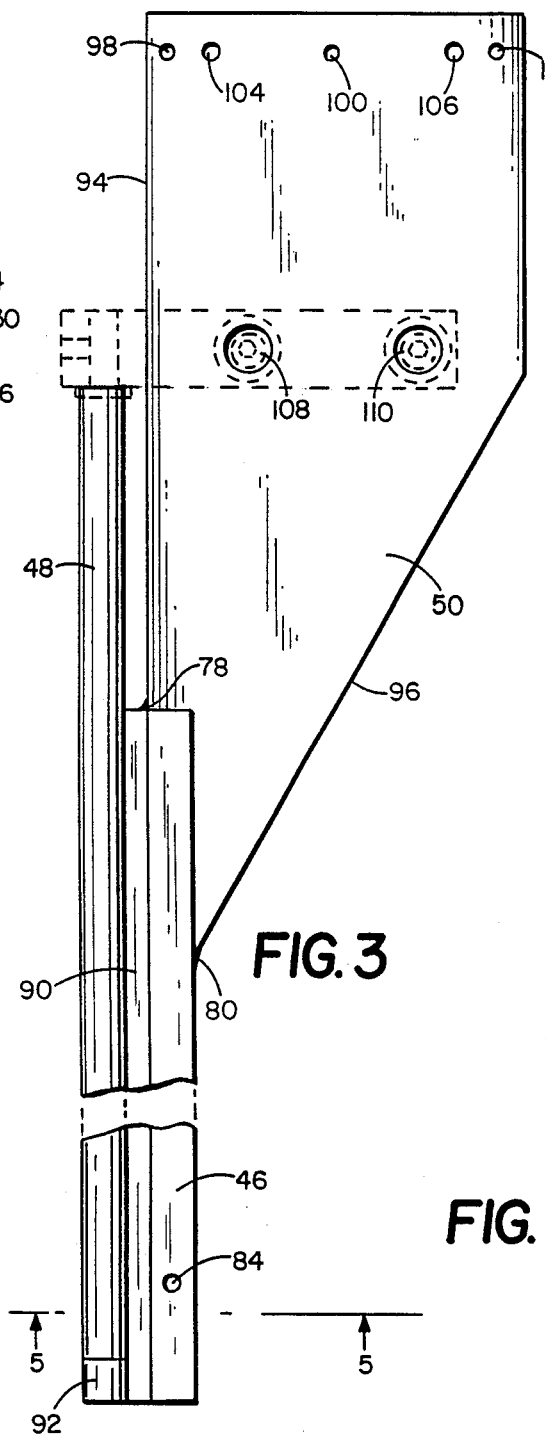
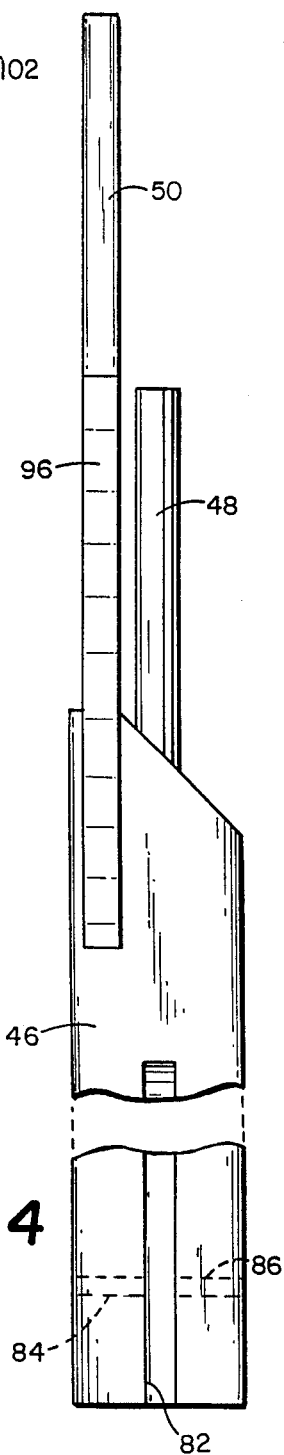
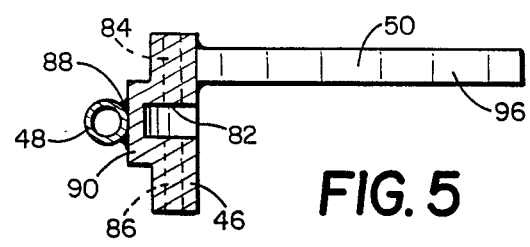
FIG. 3
FIG. 4
FIG. 6
FIG. 5

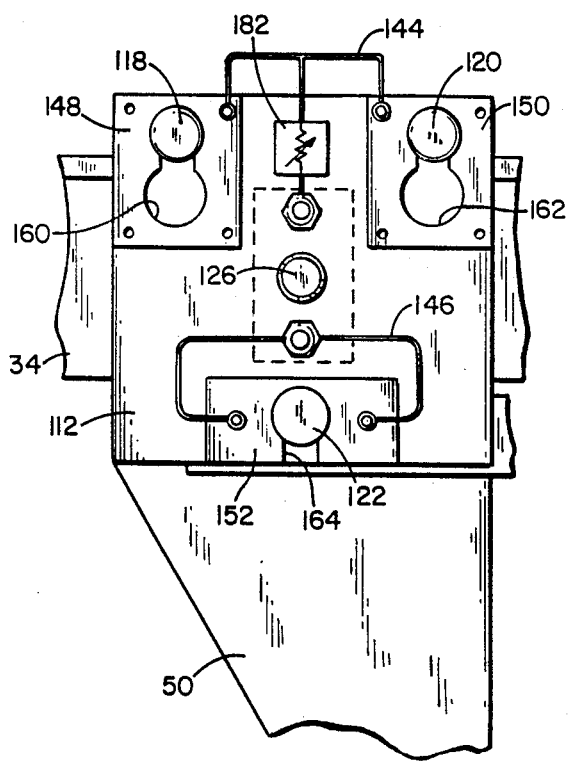
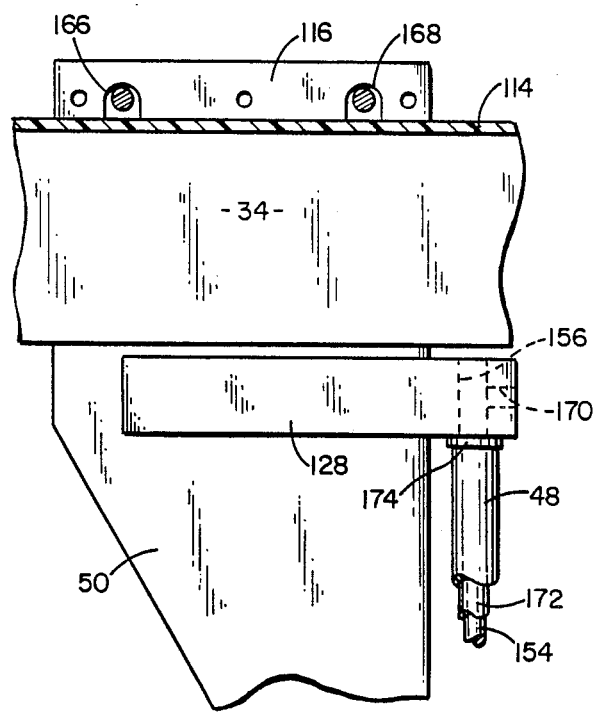
FIG. 7     FIG. 8
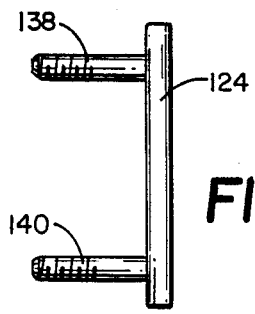
FIG. 9
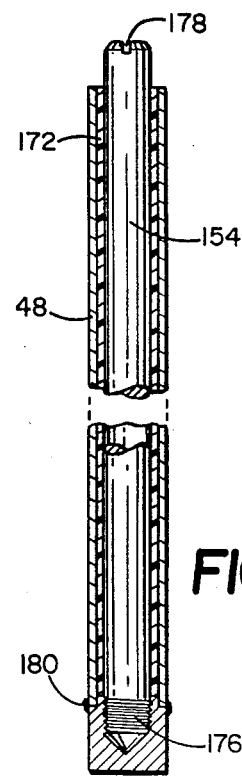
FIG. 10
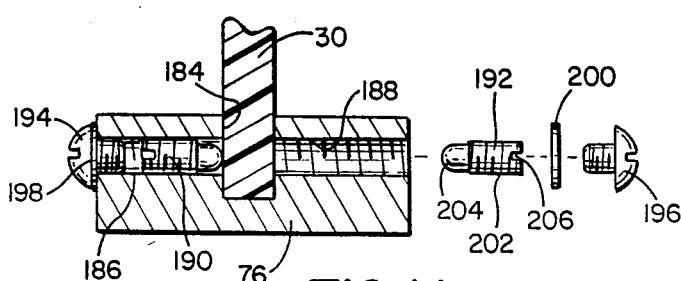
FIG. 11

ELECTROPLATING APPARATUS

BACKGROUND OF THE INVENTION

This invention relates to electroplating processes and equipment, and more particularly to means for supporting a printed circuit board immersed in a liquid electrolyte while biasing the printed circuit board and immediate supporting structure to attract metal ions from the electrolyte, thus to form a layer of plating metal over the surface of the printed circuit board.

Electroplating of metallic layers upon printed circuit boards is a well known technique, frequently employing a container or tank holding a liquid electrolyte rich in ions of the metal to be plated. The printed circuit board to be plated is immersed in the electrolyte solution and electrically coupled as a cathode. An object composed of the plating metal also is immersed in the electrolyte and coupled as an anode to provide a source of ions to the electrolyte. During electroplating, metal ions proximate the printed circuit board combine with electrons on the surface of the circuit board and are reduced to the metal. Meanwhile, the metal object or anode is gradually ionized, continually providing ions to the electrolyte.

The plating rate depends largely upon the rate at which the metal ions may be caused to flow through the electrolyte between the anode and the printed circuit board. Irregularities in the electrical field near the circuit board, particularly at projections or sharp edges (for example at through-holes), can cause unwanted discontinuities in thickness of the electroplated layer. One attempt to counteract this effect is found in U.S. Pat. No. 4,174,261 (Pellegrino), disclosing a plated article supported above the electrolyte surface as a cathode between two anode manifolds, each with an array of spray nozzles. An array of suction openings can be intermingled with each array of spray nozzles. Further, opposing manifolds can be offset such that spray nozzles of one manifold are aligned with suction openings of the other, thereby improving the plating of through-holes by forcing electrolyte through them, due to the localized pressure differential. More generally, the combination of providing electrolyte through spray nozzles and drawing away excess electrolyte through interstitially arranged suction nozzles is said to result in a more uniform thickness in the plated metal layer including walls defining through holes.

Uniformity of thickness is enhanced by organic brightener and leveler additives, according to U.S. Pat. No. 4,667,049 (Heikkila et al), which discloses one method of manufacturing dialkylamino-thioxomethyl-thioalkanesulfonic acid compounds for use in electrolyte solutions. A somewhat related disclosure centers on the quantitative determination of organic composition concentrations in plating baths. U.S. Pat. No. 4,628,726 (Heikkila et al) discloses the use of high pressure liquid chromatography to measure concentration of organic brightener additive constituents.

Yet another factor influencing the plated layer is the nature of the rack or other framework supporting the printed circuit board within the electrolyte during plating. Conventional rack designs utilize hand-operated wing nuts for mounting the circuit board and have a minimum thickness or clearance of about four inches. Such designs feed current into the rack at its top, and depend upon the conductivity of the rack to distribute current to the printed circuit board. The lack of an even current distribution can severely affect large printed circuit boards, for example square boards measuring thirty inches on one side. Racks that extend the entire length of opposite sides of the circuit board tend to enhance current distribution, yet result in uneven plating thicknesses, in particular by increased thickness near the racks and by differences in thickness from the top to the bottom of the circuit board.

Therefore, it is an object of the present invention to provide a rack or framework for supporting large circuit boards for electroplating, and for providing current to such circuit boards for a more uniform thickness in the electroplated metal layer.

Another object is to provide a compact rack design which permits closer spacing between printed circuit boards being plated and peripheral tank equipment such as manifolds and anodes.

Yet another object is to provide a means for supplying current to at least two separate locations along a vertical side edge of a printed circuit board during electroplating, and adjusting the current at one location with respect to the current at the other location to provide a more uniform electrical field proximate the printed circuit board.

SUMMARY OF THE INVENTION

To achieve these and other objects, there is provided an electroplating apparatus including a container, an electrolyte solution within the container for the electroplating of an article suspended within the container, and a metal ion source for supplying ions of the plating metal to the electrolyte solution. A substantially rigid electrically conductive support means runs substantially the length of a side edge portion of the article. The support means includes a proximal portion above the electrolyte solution and a distal portion immersed in the electrolyte solution. A fastening means along the distal portion electrically and mechanically secures the support means to the article along its side edge portion.

The apparatus further includes a mounting means integral with the container and positioned above the electrolyte solution. A guide means, integral with the support means and near its proximal portion, releasably engages the mounting means to suspend the article within the container, with the article immersed in the electrolyte solution for electroplating.

The apparatus further includes an electrical power supply and first and second electrically conductive paths connected between the power supply and the support means at respective first and second spaced apart locations along the support means. The first and second paths have respective predetermined resistances for selectively determining the ratio of electric current carried by each path as compared to the other, for selectively shaping the electrical field proximate the article as a result of the current supplied to the support means from the power supply.

In connection with plating large, planar and rectangular printed circuit boards, the support means preferably includes two elongate and vertically disposed frame members, each running along and fastened to one of two opposed vertical side edge portions of the printed circuit board. The support means further includes a horizontal bar supported above the electrolyte solution by the guide means and mounting means, with means provided to connect upper end portions of the frame members to the horizontal bar.

The frame members preferably are constructed of stainless steel, with each frame member including an elongate tube for housing a copper rod running the length of the frame member. Over the majority of its length, the copper rod is surrounded by a dielectric sleeve and thus insulated from the stainless steel frame member. A bottom portion of the rod is exposed, however, for providing current to the frame member, and thus to the printed circuit board near its bottom. Current is provided to the top of each frame member by an alternative path. By adjusting the relative current flow through these alternative paths, the electrical field about the printed circuit board can be made more uniform from top to bottom, thus to enhance the uniformity of electroplating.

To further enhance uniformity, an electrically conductive member can be attached along the bottom of the printed circuit board, to draw current toward the center of the board from the side frame members.

Each of the frame members is fastened to the printed circuit board by a series of threaded fasteners recessed within apertures provided in the associated member. If desired, threaded plugs or caps may be installed over the threaded fastener in each aperture, to prevent a buildup of plating metal which otherwise tends to fuse the fasteners within the apertures.

For applications in which printed circuit boards of varying sizes may be plated, it is advantageous to introduce a means for varying the resistance of at least one of the electrically conductive paths. This feature permits the adjustment of relative resistance of the paths to correspond to the size of the circuit board being plated. Further, it permits the monitoring of the plating process and occasional fine adjustments, to further enhance uniformity of the plating rate over the entire surface of the printed circuit board.

IN THE DRAWINGS

For a better understanding of the above and other features and advantages, reference is made to the following detailed description and the drawings, in which:

FIG. 3 is an enlarged side elevation showing a rack frame member of the apparatus;

FIG. 4 is an end elevation of the frame member shown in FIG. 3;

FIG. 5 is a sectional view taken along the line 5—5 in FIG. 3;

FIG. 6 is a sectional view taken along the line 6—6 in FIG. 2;

FIG. 7 is a side elevation taken along the line 7—7 in FIG. 6;

FIG. 8 is a sectional view taken along the line 8—8 in FIG. 6;

FIG. 9 is a side elevation of a copper plate of the apparatus;

FIG. 10 is a sectional elevation of part of the frame member; and

FIG. 11 is a sectional view taken along the line 11—11 in FIG. 2.

DETAILED DESCRIPTION OF THE PREFERRED EMBODIMENT

Figure 1:
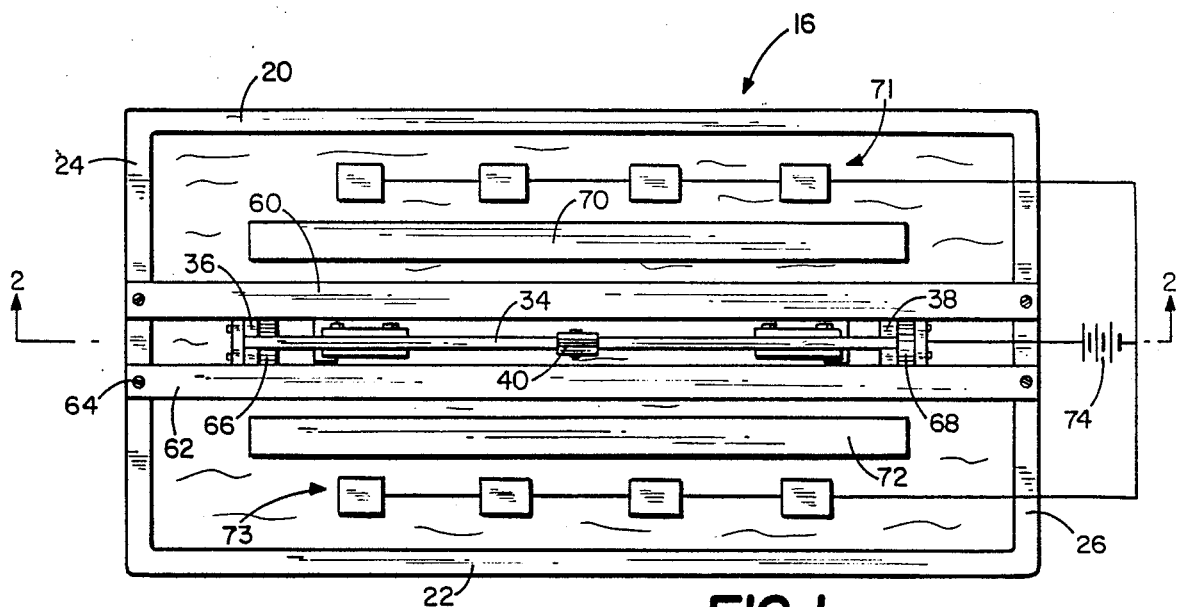
FIG. 1 is a top plan view of an electroplating apparatus constructed in accordance with the present invention.
Figure 2:
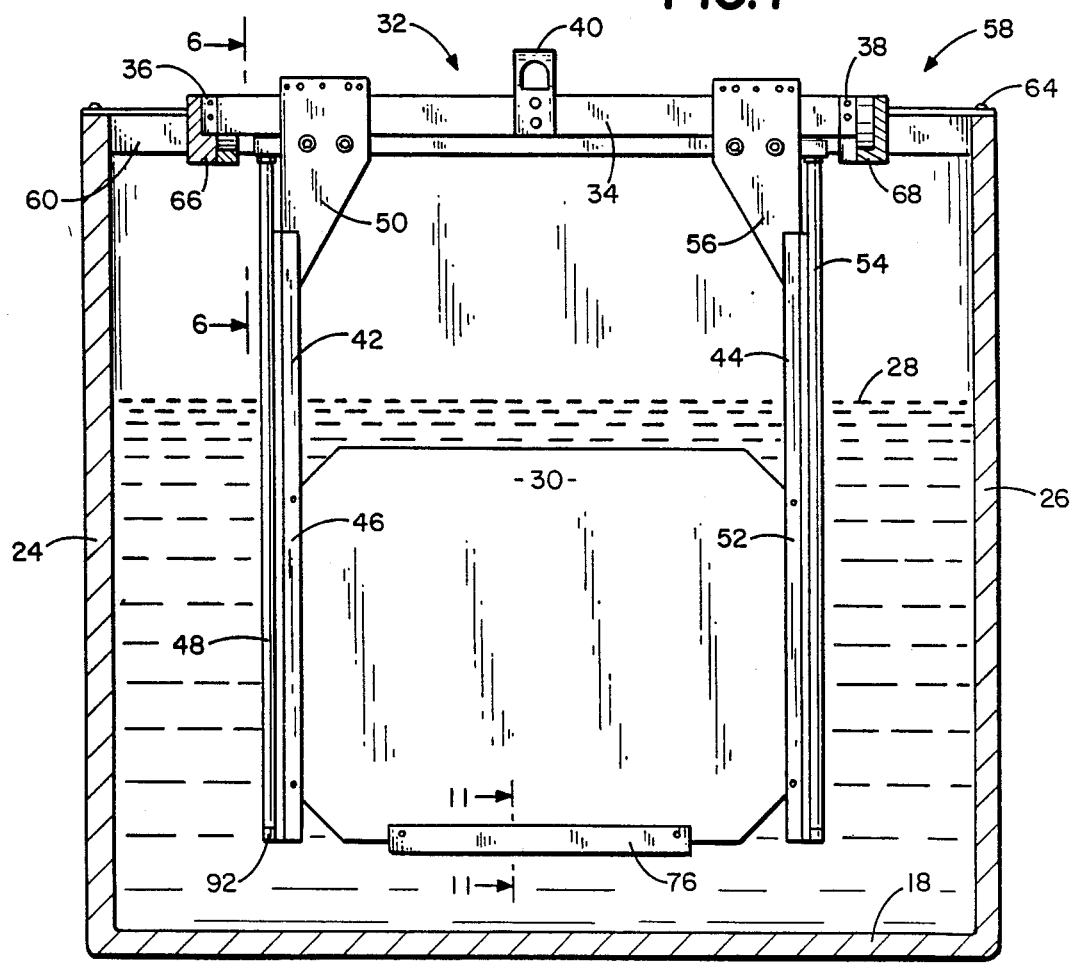
FIG. 2 is a sectional view taken along the line 2—2 in FIG. 1.

Turning now to the drawings, there is shown in FIGS. 1 and 2 an electroplating apparatus particularly well suited for plating large planar and rectangular printed circuit boards. The apparatus includes a container or tank 16 having a floor or base 18, upright side walls 20 and 22, and upright end walls 24 and 26. Tank 16 is open at the top and contains a liquid electrolyte solution. The electrolyte is not shown to facilitate illustration of other features of the system, but a broken line at 28 illustrates a typical level of electrolyte provided such that a printed circuit board 30 is totally immersed in the electrolyte solution during the plating process.

A frame assembly or rack 32 supports printed circuit board 30 for plating. Rack 32 includes an elongate, rectangular and horizontally disposed bar 34, preferably constructed of copper or other highly electrically conductive material. Guide members 36 and 38 are attached to horizontal bar 34 at its opposite ends, while a handle 40 is fixed to the bar substantially at its center.

Rack 32 further includes stainless steel left and right elongate side frames 42 and 44, secured with respect to and extending downwardly of horizontal bar 34. Left side frame member 42 includes an elongate and upright channel member 46, an elongate tube 48 parallel with and fixed to the channel member, and an upper inclined plate 50 secured to the top of the channel member. Right side frame 44 is similarly constructed, including a channel member 52, an elongate tube 54 and an upper inclined plate 56.

Frame assembly or rack 32 is supported by a rack mounting assembly 58 including a pair of elongate, horizontally disposed angle members 60 and 62 secured to end walls 24 and 26 by screws 64. Mounting saddles 66 and 68, each shaped to conform with and receive guide members 36 and 38, are secured to angle members 60 and 62 and spaced apart from one another a distance corresponding to the length of horizontal bar 34. For a more detailed description of the guide members and mounting saddles, reference is made to U.S. patent application Ser. No. 331,876, entitled CRADLE FOR SUPPORTING A PRINTED CIRCUIT BOARD BETWEEN PLATING MANIFOLDS (Murphy et al), filed Apr. 3, 1989 and assigned to the assignee of the present application.

A pair of plating manifolds 70 and 72 are mounted to and extend upwardly of floor 18 on opposite sides of printed circuit board 30. As explained in further detail in the aforementioned Murphy et al application, manifolds 70 and 72 are provided with an array of spray nozzles or pressure orifices, for providing electrolyte to the surface of printed circuit board 30 in the form of streams or jets. If desired, further vacuum manifolds may be mounted in tank 16 for providing an array of vacuum orifices interstitially of the pressure orifices, although such vacuum manifolds are not illustrated in FIG. 1.

A pair of anode assemblies 71 and 73 are mounted in the tank on opposite sides of circuit board 30, beyond manifolds 70 and 72, respectively. The anodes provide ions of the plating metal in the electrolyte. The ions in turn combine with electrons at the surface of printed circuit board 30 to form an electroplated metal layer.

A direct current for plating is provided by an electrical power supply 74. Printed circuit board 30, through horizontal bar 34, is connected to the power supply as a cathode. Anodes 71 and 73 also are connected to the power source. In brief, the anodes and the printed circuit board become oppositely charged due to the current provided by power supply 74, which leads to the attraction of metal ions by printed circuit board 30, and the replenishment of ions to the electrolyte at anodes 71 and 73. While the anodes appear as vertical, rectangular bars, it should be recognized that alternative structures, for example a container of pellets or similar small pieces of the plating metal, can be used in lieu of individual bars. For more detailed descriptions of the anodes, manifolds and the electroplating process generally, reference is made to the aforementioned patent application and U.S. Pat. No. 4,174,261. In contrast to the process described in that patent, the present electroplating process preferably is performed with the anodes, manifolds and printed circuit board immersed in electrolyte.

A conductive channel member or cathode thief 76, like side frames 42 and 44 constructed of stainless steel, is secured to printed circuit board 30 along its bottom edge in a manner similar to the attachment of the frame members, as is later explained in connection with FIG. 11. The channel member is not in contact with side frames 42 and 44, yet nonetheless assists in distributing electrical current from the side edges to the central areas of printed circuit board 30.

Left side frame 42 is shown in greater detail in FIG. 3. Tube 48 and upper plate 50 are attached to channel member 46 by titanium stabilized welds, two of which are indicated at 78 and 80. These components of side frame 42 are constructed of a type of steel known as 316 L. Consequently the side frame can withstand repeated nitric acid stripping, performed between electroplating processes to remove the plated metal.

Channel member 46 and tube 48 are elongate in the vertical direction, each with a uniform horizontal or transverse cross-section over most of its length. Channel member 46 is milled along most of its length to form a channel 82 (FIGS. 4 and 5) having a width slightly greater than the thickness of printed circuit board 30, and a depth suitable to receive a vertical side edge region of the circuit board. Opposed pairs of apertures are formed through channel member 46 on opposite sides of channel 82 and arranged along the length of the channel member. Two such apertures are indicated at 84 and 86 in FIG. 4. The walls of apertures 84 and 86 are internally threaded for containing recessed fastening members for integrally securing printed circuit board 30 to channel member 46 in a manner to be described. Substantially identical apertures and fasteners are provided in channel members 52 and 76 for their securement to the printed circuit board.

As seen from FIG. 5 at 88, tube 48 is welded to a central portion 90 of channel member 46 along the majority of the channel member length. An end cap 92, welded to channel member 46 and tube 48, provides a fluid seal at the bottom of the tube.

Upper plate 50 includes a vertical edge 94 and an inclined edge 96, and has a rectangular surface area suitable for securing side frame 42 with respect to horizontal bar 34. Openings at 98, 100 and 102 accommodate screws used to mount an elongate, stainless steel support bar to upper plate 50, while two slightly larger openings at 104 and 106 accommodate copper screws that form part of an electrically conductive path from horizontal bar 30 to the top of side frame 42. Openings at 108 and 110 accommodate screws used in mounting a conductive rectangular copper bar with respect to plate 50.

While only side frame 42 has been described in detail, it is to be recognized that side frame 44 is substantially the mirror image of side frame 42, and thus is not further described.

The manner in which side frame 42 is mounted with respect to the horizontal bar 34 is shown in FIG. 6. In particular, the upper rectangular portion of upper plate 50 and an electrically insulative support fixture or block 112 are maintained on opposite sides of the horizontal bar. Insulative block 112 preferably is constructed of chlorinated polyvinyl chloride or other substantially rigid and durable material.

Insulative block 112 and upper plate 50 are secured with respect to horizontal bar 34 by a combination of friction and gravity, although neither of these members directly contacts the horizontal bar. The horizontal bar is covered in the area proximate plate 50 by a dielectric layer 114. The rectangular surface of plate 50 facing the horizontal bar is contiguous with the dielectric layer. An elongate, rectangular stainless steel support bar 116, fastened to plate 50 with screws entering the aforementioned openings 98–102, rests upon dielectric layer 114 immediately over the top of horizontal bar 34, whereby the assembly of plate 50 and block 112 is supported by gravity.

The frictional gripping force upon the horizontal bar is provided by copper screws 118 (FIG. 7), 120 and 122, in combination with a flat and rectangular copper plate 124 and a cap screw 126 threadedly engaged within and extending through insulative block 112. In particular, copper screws 118 and 120 are threaded into inclined plate 50 and copper screw 122 is threaded into an elongate, rectangular copper conductor 128 secured with respect to plate 50 by two cap screw fasteners, one of which is illustrated at 130. An insulative pad 132 and an insulative sleeve 134 electrically isolate conductor 128, cap screw fastener 130, and a washer 136 from the upper plate. Copper screws 118, 120 and 122 thus determine a maximum spacing between plate 50 and insulative block 112. Cap screw 126 is turned to travel toward horizontal bar 34, or to the right as viewed in FIG. 6, a sufficient distance to drive copper plate 124 against the horizontal bar, which in turn tends to force block 112 leftward, thus urging plate 50 leftward against dielectric layer 114. Thus, the assembly including side frame 42 and insulative block 112 becomes integrally secured with respect to the horizontal bar.

As seen in FIG. 9, a pair of threaded copper terminal posts 138 and 140, integral with copper plate 124, extend outwardly of the plate and through corresponding openings in insulative block 112. Provided on each terminal is a pair of hexagonal nuts 142 to facilitate connection of one or more electrically conductive wires to the terminal, as shown at 144 and 146 in FIG. 7. Also visible in that figure are flat and rectangular copper plates 148, 150 and 152 embedded into insulative block 112. Wires 144 are connected to conductive plates 148 and 150 and form part of a first electrically conductive path between horizontal bar 34 and side frame 42, with the path including copper plate 124, terminal post 138, the wires at 144, their associated embedded copper plates 148 and 150, and copper screws 118 and 120.

A second electrically conductive path runs from the horizontal bar to the bottom of side frame 42, and includes copper plate 124, terminal post 140, wires 146, embedded copper plate 152, copper screw 122, copper conductor 128, and an elongate and cylindrical copper rod 154 releasably mounted within a vertical opening 156 in conductor 128 by means of an Allen head screw 158. Keyways 160 and 162 formed in block 112 and embedded plates 148 and 150, and a notch 164 in the block and plate 152, accommodate copper screws 118, 120 and 122 respectively, for convenient mounting of side frame 42.

In FIG. 8, insulative block 112 and its associated parts are removed to reveal the manner in which stainless steel support bar 116 rests upon dielectric layer 114. Inverted U-shaped cutouts 166 and 168 are provided in the support bar to accommodate copper screws 118 and 120. The upper end of copper rod 154 is contained within vertical opening 156, with a horizontal opening 170 in communication with vertical opening 156 and accommodating Allen head screw 158. Copper rod 154 is surrounded by an insulative sheath 172 of heat shrink tubing, with the rod and sheath being contained within tube 48. The upper end of the tube and the bottom surface of conductor 128 are electrically isolated from one another by an insulative ring seal 174 to form a substantially fluid tight enclosure around the copper rod.

As seen in FIG. 10, insulative sheath 172 surrounds copper rod 154 over the majority of its length, leaving the rod exposed only at the top portion housed within vertical opening 156, and at an externally threaded bottom portion 176 of the rod. Utilizing a slot 178 at the top of rod 154, the rod is threadedly engaged with stainless steel end cap 92 welded to the bottom of tube 48 as indicated at 180. Thus, copper rod 154 is entirely surrounded by stainless steel, and comprises part of the second electrically conductive path from horizontal bar 34 to the bottom of side frame 42, specifically end cap 92. Again, it should be noted that side frame 44 and its associated mounting assembly are substantially identical to that just described.

The amount of electrical current supplied to the side frames, e.g. side frame 42, of course depends upon the nature of power supply 74. Moreover, the current delivered to the top of side frame 42, as compared to the current delivered to the bottom of the frame, depends upon the total impedance or resistance of the first electrically conductive path as compared to the second path. In particular, the resistance of path 144, particularly as compared to that of path 146 (FIG. 7), can be selected to provide a desired difference between the current supplied to the top of the frame member and the current supplied to the bottom. A variable resistance, illustrated schematically at 182 in FIG. 7, facilitates adjustment of the resistance (or electrical current through) the two conductive paths, either to permit monitoring and fine tuning of comparative resistance during a particular electroplating process, or to permit a broader range of adjustment in accordance with electroplating various sizes of printed circuit boards or other articles. It is to be appreciated that further wires can be connected between horizontal bar 34 and side frames 42 and 44 at intermediate locations for further control over the current distribution.

FIG. 11 illustrates the manner in which channel member 82 is attached to the bottom edge portion of printed circuit board 30 as shown in FIG. 2. Connection of side frames 42 and 44 to the opposite side edge portions of the printed circuit board is accomplished in substantially the same manner. As to channel member 82, the bottom portion of the circuit board is positioned within an upwardly facing channel or groove 184 formed longitudinally of member 82. Apertures 186 and 188, formed through bottom channel member 82 on opposite sides of the channel, accommodate embedded fasteners 190 and 192. Cover screws 194 and 196 are secured respectively in the same openings, each maintaining a rubber ring seal (at 198 and 200, respectively) against channel member 82.

Each of fasteners 190 and 192 is externally threaded as at 202 to correspond to the internally threaded apertures, and has a rounded, substantially hemispherical tip 204 designed to press against printed circuit board 30 and maintain it with respect to channel member 82. A slot 206 facilitates turning of each fastener. Accordingly, the first step in securing printed circuit board 30 with respect to channel member 82, and likewise channel members 46 and 52, is to advance each opposed pair of fasteners 190-192 toward the circuit board until the board is secured between the opposing tips 204. Next, opposed pairs of ring seals 198-200 and cover screws 194-196 are installed, in order to prevent buildup of the plating metal in the area of the fasteners, which otherwise might fuse the fasteners to their associated channel members.

The clearance between adjacent racks is determined by the assembly mounting the upper plates with respect to their associated horizontal bars, which results in a clearance of about two inches as compared to a four inch clearance in conventional mounting systems employing hand-adjusted wing nuts to secure the printed circuit boards. Also, the combination of a highly conductive copper rod and the stainless steel frame member completely surrounding the copper rod affords effective conduction of current to the bottom of each rack, yet completely protects and isolates the copper rod from the electrolyte and plating metal. Consequently the only surfaces of the rack which require periodic cleaning or nitric acid stripping, to remove the plating metal, are constructed of stainless steel. The rack thus maintains its utility and structural integrity over a useful life including numerous electroplating processes and nitric acid strippings.

Further, the rack provides for a more uniform electrical field about the printed circuit board as it is plated, both from top to bottom and from the outside edge portions to the middle due to bottom channel member 82. As a result, plating tends to occur more evenly with a finished layer of more uniform thickness. Finally, by providing a means for adjusting the comparative conductivities of respective conductive paths to the top and bottom of the rack, the rack assembly facilitates fine adjustments to the electrical field as a result of continual monitoring of the plating process, as well as adjustments undertaken to accommodate different sizes of printed circuit boards.

I claim:
1. An electroplating apparatus including:
a container, an electrolyte solution within said container for the electroplating of an article suspended within the container, and a body comprised of a plating metal ion source for supplying ions of said plating metal to said electrolyte solution; a substantially rigid electrically conductive support means running substantially the length of a side edge portion of said article, said support means including a proximal portion above said electrolyte solution and a distal portion immersed in said electrolyte solution, and a fastening means along said distal portion for electrically and mechanically securing said support means to said article along said side edge portion;

a mounting means integral with said container and positioned above said electrolyte solution;

a guide means, integral with said support means and near said proximal portion thereof, for releasably engaging said mounting means to suspend said article within said container, with said article immersed in said electrolyte solution for electroplating;

an electrical power supply, and first and second electrically conductive paths connected between said power supply and said support means at respective first and second spaced apart locations along said support means, said first location being at least proximate the proximal portion of the support means and said second location being at least proximate a distal end of the distal portion of the support means, said first and second paths having respective first and second predetermined resistances for selectively determining the amount of electric current carried by each of said first and second paths as compared to the other, for selectively shaping the electrical field proximate said article as a result of the current supplied to said support means from said power supply.

2. The electroplating apparatus of claim 1 wherein:
said article comprises a substantially planar and rectangular printed circuit board having two opposed upright side edge portions, and wherein said support means includes two elongate, vertically disposed side frame members, each associated with one of said side edge portions of said printed circuit board; said support means further including a horizontal bar supported by said mounting means and said guide means, and disposed above said electrolyte solution, and a means for connecting respective upper end portions of said side frame members with respect to said horizontal bar.

3. The apparatus of claim 2 wherein:
each of said side frame members includes a channel running longitudinally thereof and recessed from a surface of the side frame member facing said printed circuit board, to accommodate its associated one of said side edge portions, and a plurality of fasteners are mounted in apertures in each said frame member, said fasteners movable inwardly and transversely of the side frame members to engage said side edge portions, to releasably secure said side frame members to said printed circuit board.

4. The apparatus of claim 3 wherein:
said fasteners and the surfaces of said side frame members defining said apertures are threadedly engaged.

5. The apparatus of claim 4 further including:
a plurality of externally threaded plugs, one associated with each of said threaded fasteners, each plug being positioned outwardly of its associated fastener.

6. The apparatus of claim 2 wherein:
said first conductive path is electrically connected between said power supply and the upper end portion of each of said side frame members, and wherein said second electrically conductive path is connected between said power supply and a bottom portion of each of said side frame members.

7. The apparatus of claim 6 wherein:
each of said side frame members is constructed of stainless steel, said second path including first and second vertically disposed elongate copper rods, respectively associated with each of said frame members, each rod spanning the length of its associated frame member.

8. The apparatus of claim 7 wherein:
the portion of each of said copper rods below the surface of said electrolyte solution is totally surrounded by its associated frame member.

9. The apparatus of claim 8 wherein:
each of said copper rods is cylindrical and surrounded by a dielectric sleeve running substantially the length of said rod while leaving a bottom portion of said rod exposed; and
wherein each of said side frame members includes an elongate tubular section with an interior diameter larger than the diameter of its associated one of said rods, whereby said rod and said sleeve are contained within the tubular section; said side frame member further including an end cap at the bottom of said tubing section and adapted to electrically and mechanically engage said exposed bottom portion of said associated rod.

10. The apparatus of claim 9 wherein:
said end cap and bottom portion of said rod are threadedly engaged.

11. The apparatus of claim 9 wherein:
said horizontal bar is constructed of copper and electrically connected to said power supply;
said first electrically conductive path being connected between said horizontal bar and said upper end portions of said frame members, said second electrically conductive path being connected between said horizontal bar and said end caps.

12. The apparatus of claim 11 wherein:
said first electrically conductive path includes a first conductive wire means connected between said horizontal bar and said upper end portions of said first and second side frame members, and wherein said second electrically conductive path includes a second wire conductive means connected between said horizontal bar and said first and second copper rods; and
wherein said first and second conductive means have respective first and second predetermined resistance values for determining the resistances of said conductive paths, thereby to selectively shape said electrical field.

13. The apparatus of claim 12 further including:
a variable resistance means along said first conductive means, for adjusting the resistance value of said first electrically conductive path.

14. The apparatus of claim 2 wherein:
said means for connecting said upper end portions of the side frame members to said horizontal bar include an enlarged, substantially, flat upper plate integral with and extended upwardly of the upper end portion of each frame member, a substantially planar mounting plate associated with each of said upper plates, and a plurality of threaded fasteners for securing each upper plate and associated mounting plate on opposite sides of said horizontal bar.

15. The apparatus of claim 14 further including:

a layer of a dielectric material between said horizontal bar and each of said upper plates to electrically isolate said bar from said upper plates.

16. The apparatus of claim 15 further including:
a horizontal support member integral with each of said upper plates and positioned above said copper bar and supported on said horizontal bar through said dielectric layer, whereby each of said frame members is supported with respect to said horizontal bar at least in part by gravity.

17. The apparatus of claim 2 further including:
an elongate electrically conductive channel member secured to a bottom edge portion of said printed circuit board.

18. An apparatus for electroplating a printed circuit board or other article, including:
a container, an electrolyte solution within the container for electroplating an article supported within the container, a source of plating metal ions for supplying ions of the plating metal to the electrolyte solution; first and second elongate, vertically disposed side frame members, each side frame member associated with one of two opposed upright side edge portions of the article, each side frame member further being electrically conductive and running substantially the length of its associated side edge portion; and a fastening means along each of said side frame members for electrically and mechanically securing the side frame members to the article along the side edge portions;
a mounting means integral with the container;
a guide means, integral with the side frame members and near respective upper end portions thereof, for releasably engaging the mounting means to suspend said article within said container, with said article immersed in the electrolyte solution for electroplating; and
an electrical power supply, and first and second electrically conductive paths connected between said power supply and each of said side frame members at respective first and second locations therealong, said first locations being the respective upper end portions of the side frame members and said second locations being respective bottom portions of the side frame members, said first and second paths having respective first and second predetermined resistances for selectively determining the amount of electric current carried by each of the first and second paths as compared to the other, for selectively shaping the electrical field proximate said article as a result of the current supplied to each of the side frame members from said power supply.

19. The apparatus of claim 18 further including:
an electrically conductive horizontal bar supported by said mounting means and said guide means, and a means for connecting the respective upper end portions of said side frame members with respect to the horizontal bar.

20. The apparatus of claim 19 wherein:
said horizontal bar, when supported by the mounting means, is above said electrolyte solution.

* * * * *